US012618872B2

(12) United States Patent
Molnar et al.

(10) Patent No.: US 12,618,872 B2
(45) Date of Patent: May 5, 2026

(54) CURRENT SENSING SYSTEM

(71) Applicant: Vitesco Technologies GmbH, Regensburg (DE)

(72) Inventors: Laszlo Molnar, Munich (DE); Octavian Luca, Munich (DE)

(73) Assignee: Vitesco Technologies GmbH, Regensburg (DE)

( * ) Notice: Subject to any disclaimer, the term of this patent is extended or adjusted under 35 U.S.C. 154(b) by 158 days.

(21) Appl. No.: 18/720,773

(22) PCT Filed: Dec. 12, 2022

(86) PCT No.: PCT/EP2022/085320
§ 371 (c)(1),
(2) Date: Jun. 17, 2024

(87) PCT Pub. No.: WO2023/110715
PCT Pub. Date: Jun. 22, 2023

(65) Prior Publication Data
US 2025/0052786 A1 Feb. 13, 2025

(30) Foreign Application Priority Data

Dec. 16, 2021 (EP) ..................................... 21465573
Dec. 17, 2021 (DE) ..................... 10 2021 214 606.6

(51) Int. Cl.
*G01R 1/20* (2006.01)
*G01R 19/00* (2006.01)
(Continued)

(52) U.S. Cl.
CPC ......... *G01R 1/203* (2013.01); *G01R 19/0023* (2013.01); *G01R 19/16542* (2013.01); *G01R 19/32* (2013.01)

(58) Field of Classification Search
CPC ................ G01R 1/203; G01R 19/0023; G01R 19/16542; G01R 19/32; G01R 31/36; G01R 31/364; H01M 10/48
See application file for complete search history.

(56) References Cited

U.S. PATENT DOCUMENTS 11,885,852 B2 1/2024 Takai
2005/0052809 A1 3/2005 Evans et al.
(Continued)

FOREIGN PATENT DOCUMENTS

DE 112005000986 T5 3/2007
DE 112020001524 T5 12/2021
(Continued)

*Primary Examiner* — Huy Q Phan
*Assistant Examiner* — David B Frederiksen
(74) *Attorney, Agent, or Firm* — Laurence A. Greenberg; Werner H. Stemer; Ralph E. Locher

(57) ABSTRACT

A current sensing system includes a busbar connected in a current path between a power supply and a load. The busbar includes a temperature dependent resistance with a specific temperature coefficient. An amplifier is configured to sense a voltage difference across a section of the busbar caused by a current in the current path. The current sensing system includes a temperature compensation circuit, wherein the temperature compensation circuit is effective as a temperature dependent resistance with a temperature coefficient which has a sign opposite from the resistance of the busbar. A first input of a comparator is directly or indirectly connected to a second terminal of the signal conditioning circuit. The current sensing system includes a logic circuitry, which is configured to control a state of a switch, which is disposed in the current path dependent on an output signal of the comparator.

14 Claims, 2 Drawing Sheets

(51) Int. Cl.
    *G01R 19/165*          (2006.01)
    *G01R 19/32*           (2006.01)

(56)           References Cited

U.S. PATENT DOCUMENTS

| | | | |
|---|---|---|---|
| 2007/0103174 A1 | 5/2007 | Tanaka | |
| 2014/0015515 A1 | 1/2014 | Satou | |
| 2014/0320150 A1 | 10/2014 | Sato | |
| 2019/0170791 A1* | 6/2019 | Hetzler | G01R 1/203 |
| 2021/0263079 A1* | 8/2021 | Schwarzberger | G01R 15/207 |
| 2022/0317165 A1* | 10/2022 | Beck | G01R 1/203 |

FOREIGN PATENT DOCUMENTS

| | | | |
|---|---|---|---|
| EP | 3678295 A1 | 7/2020 | |
| JP | S62223680 A | 10/1987 | |
| JP | H06242176 A | 9/1994 | |
| WO | 2021104670 A1 | 6/2021 | |

* cited by examiner

CURRENT SENSING SYSTEM

FIELD AND BACKGROUND OF THE INVENTION

The present disclosure relates to a current sensing system.

To control the flow of energy and optimize efficiency in powertrain subsystems of hybrid and electric vehicles, which include, for example, traction inverters, on-board chargers, DC/DC converters and battery management systems (BMS), precise current measurement is essential. After all, the aforementioned subsystems have to measure high currents—and at high voltages of typically over 400 V. In recent years, the current used in these electronic devices has been increased up to about 1 kA, for example. In this case, in order to ensure safety when the circuit is short-circuited, it is necessary to control the short-circuit current. Often an isolated current measurement is used.

There are various methods available for isolated current measurements. Shunt-based methods with isolated amplifiers or isolated modulators are mainly used in hybrid and electric vehicles. However, the voltage drop across the shunt resistor results in losses and corresponding heating. Therefore, the shunt resistor used for this purpose is required to have a low resistance value of, for example, 100 µΩ or less. Therefore, technical improvements to shunt resistors are being worked on so that they become lighter/smaller and have lower resistance values while maintaining or even improving accuracy and drift characteristics.

It is an object of the present disclosure to provide a current sensing system which has a small size and low power dissipation and provides precise overcurrent detection.

SUMMARY OF THE INVENTION

The invention is defined by the independent claim. Advantageous embodiments of the invention are given in the dependent claims.

According to a first aspect the present disclosure relates to a current sensing system. The current sensing system comprises a busbar connected in a current path between a power supply and a load.

A switch is arranged in the current path to disconnect the current path, in particular when an overcurrent is detected.

In at least one embodiment the busbar comprises a copper alloy, wherein the copper alloy comprises copper (Cu), nickel (Ni) and silicon (Si), or comprises copper and silicon. Many of the high current applications include Cu or CuNiSi busbars as current carrying elements, therefore it is a main aspect of the disclosure to use a section of the busbar as current sensing element. Using a busbar instead of a separate shunt resistor provides the advantage that separate shunt resistor or hall sensor can be avoided. Thus, not only costs but also space can be saved, and additional power dissipation can be minimized.

The current sensing system comprises an amplifier with a first input and a second input and an output. The first input and the second input are connected to the busbar, such that the amplifier is configured to sense a voltage difference or voltage drop across a section of the busbar caused by a current flow in the current path.

In at least one embodiment the amplifier comprises an isolated amplifier with a galvanic isolation.

As the busbar comprises a temperature dependent resistance with a specific temperature coefficient the current sensing system comprises a signal conditioning circuit. The signal conditioning circuit comprises a first terminal and a second terminal and a temperature compensation circuit. The first terminal is connected to the output of the amplifier. The temperature compensation circuit effects as a temperature dependent resistance with a temperature coefficient which has an opposite sign as the resistance of the busbar.

In at least one embodiment the resistance of the busbar comprises a positive temperature coefficient.

The current sensing system comprises a comparator with a first input and a second input, wherein the first input of the comparator is directly or indirectly connected to the second terminal of the signal conditioning circuit.

As the temperature dependency of the resistance of the busbar is at least partly compensated by the temperature compensation circuit, a fixed overcurrent threshold for the comparator can be used as the tolerance for the resulting shut-OFF current is sufficiently small.

Furthermore, the current sensing system comprises a logic circuitry, wherein the logic circuitry is configured to control a state of the switch, which is arranged in the current path dependent on an output signal of the comparator.

The current sensing system has, besides the benefit that the busbar can be used as sensing element, the additional advantage that the temperature dependency of the sensing element is compensated by a low cost and fast hardware solution. It is not necessary to calculate complicated and time-consuming temperature compensation algorithms in a microcontroller.

In at least one embodiment according to the first aspect the signal conditioning circuit comprises a first resistor, wherein the first resistor and the temperature compensation circuit are connected in series between the first terminal and a third terminal of the signal conditioning circuit and an intermediate node, which is arranged between the first resistor and the temperature compensation circuit, is directly or indirectly connected to the second terminal.

In at least one embodiment according to the first aspect the temperature compensation circuit comprises a resistor and a diode connected in series. Preferably the cathode of the diode is directly or indirectly connected to the third terminal of the signal conditioning circuit. In particular, the diode comprises a temperature dependent resistance with a negative temperature coefficient. The diode may comprise a transistor which is wired such that it effects or functions as a diode.

In at least one embodiment according to the first aspect the diode is a silicon diode with a p-n junction. In particular, the diode does not comprise a Schottky barrier.

When the busbar uses a material, which has a negative temperature coefficient, a silicon carbide (SiC) Schottky barrier diode may be used which has a positive temperature coefficient.

In at least one embodiment according to the first aspect a ratio of a resistance value of the first resistor to a resistance value of the resistor of the temperature compensation circuit is equal to an amount of a ratio of a busbar value and a diode value, wherein the busbar value represents an increase of the amplified voltage drop of the busbar due to a temperature increase in a pre-defined temperature range and the diode value represents an decrease of a forward voltage of the diode due to the temperature increase in the pre-defined temperature range. This allows to provide a temperature independent or less temperature dependent output voltage on the second terminal.

In at least one embodiment according to the first aspect the intermediate node between the first resistor and the temperature compensation circuit is connected to a voltage divider circuit and an intermediate node of the voltage divider circuit is connected to the second terminal of the signal conditioning circuit. This allows to adjust the output signal level of the amplifier to a threshold voltage level of the comparator.

Furthermore, according to a second aspect the present disclosure relates to a catalyst system for a vehicle, comprising a current sensing system according to the first aspect and a catalyst, wherein the catalyst is connectable via the busbar to a power supply.

Advantageous embodiments of the first aspect are also valid for the second aspect.

BRIEF DESCRIPTION OF THE FIGURES

It is to be understood that both the foregoing general description and the following detailed description are merely exemplary and are intended to provide an overview or framework to understand the nature and character of the claims. The accompanying drawings are included to provide a further understanding and are incorporated in this description. The drawings illustrate one or more embodiments, and together with the description serve to explain principles and operation of the various embodiments.

In the figures, the same reference signs are used for elements with essentially the same function, but these elements need not be identical in all details. The drawings are not necessarily drawn to scale but are configured to clearly illustrate the disclosure.

DETAILED DESCRIPTION OF THE INVENTION

The present disclosure will now be described in greater detail hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. While features of the present disclosure may be discussed relative to certain embodiments and figures below, all embodiments of the present disclosure can include one or more of the advantageous features discussed herein. In other words, while one or more embodiments may be discussed as having certain advantageous features, one or more of such features may also be used in accordance with the various embodiments of the disclosure discussed herein. In similar fashion, while exemplary embodiments may be discussed below as device, system, or method embodiments it should be understood that such exemplary embodiments can be implemented in various devices, systems, and methods.

It is understood that when an element is designated as "connected" or "coupled" to another element, it may be directly connected or coupled to the other element, or intermediate elements may be present. In contrast, when an element is designated as "directly connected" or "directly coupled" to another element, no intermediate elements are present.

Figure 1:
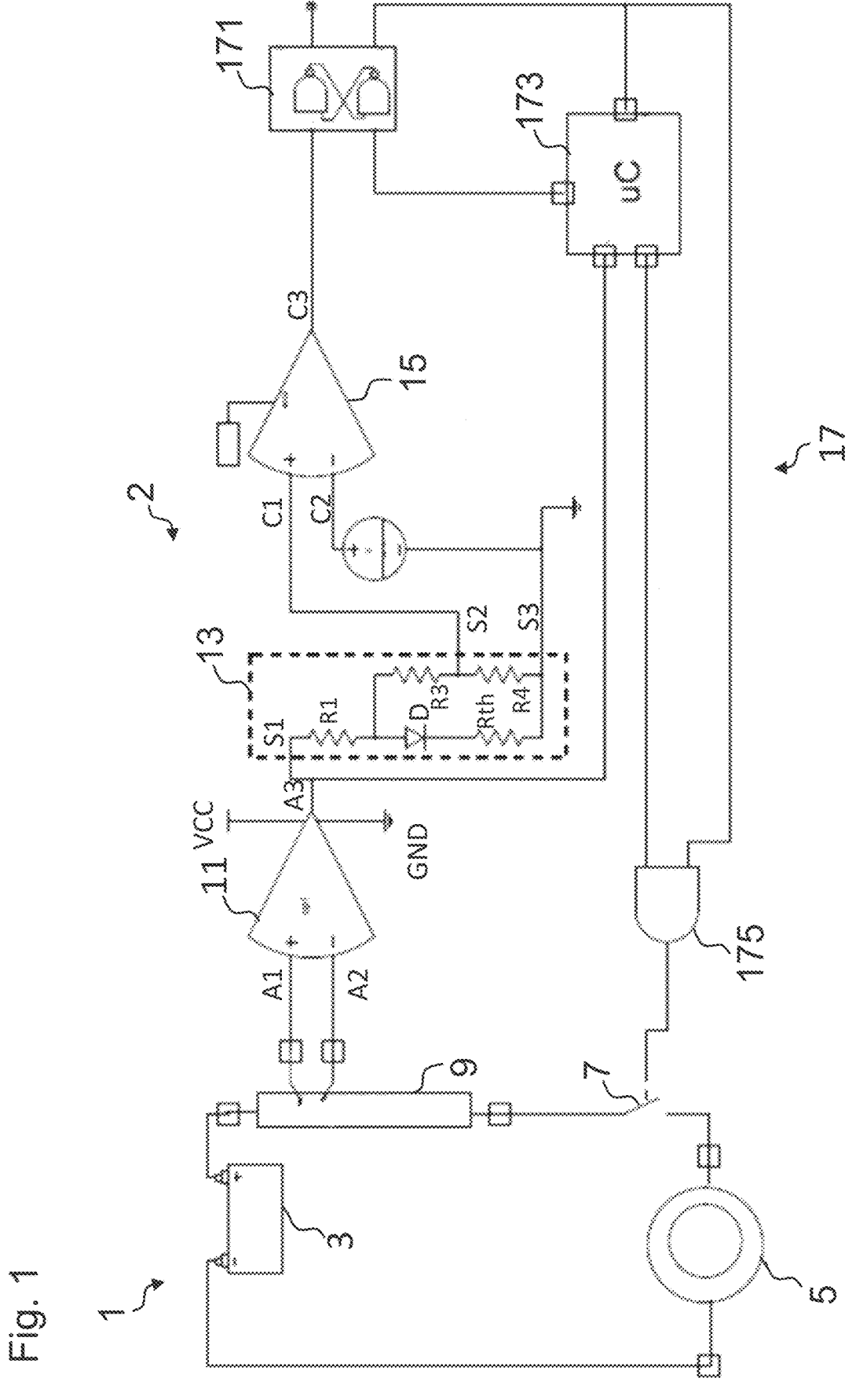
Figure 2:

FIG. 1 shows an equivalent circuit diagram of an exemplary embodiment of the current sensing system and FIG. 2 shows an exemplary diagram of a resistance value of an exemplary busbar.

In FIG. 1 a high voltage system 1 and a current sensing system 2 are shown. The high voltage system 1 comprises a power supply 3, a load 5, and a switch 7. The power supply 3 may be a high voltage battery of an electric vehicle or a hybrid vehicle. The load 5 may be a resistive or inductive load of an electric vehicle or a hybrid vehicle. The load 5 is a catalyst of a catalyst system which includes the current sensing system 2 and the lad 5.

The power supply 3 is electrically conductive connected via the switch 7 to the load 5. Therefore, there is a current path between the power supply 3 and the load 5 which can be disconnected by the switch 7, for example if an overcurrent is detected.

In the current path a busbar 9 is arranged. The busbar 9 is used as current sensing element for the current sensing system 2. The busbar 9 comprises a copper alloy, wherein the copper alloy comprises copper, Cu, nickel, Ni, and silicon, Si, or comprises Cu and silicon.

Copper alloy CuNiSi and copper alloy CuNi each comprises a temperature dependent resistance with a positive temperature coefficient. Therefore, a resistance value of the busbar 9 increases with increasing temperature.

In FIG. 2 an exemplary diagram of a resistance value of an exemplary busbar 9 is shown. In the example shown in FIG. 2, the resistance value increases by approximately 50% in the temperature range from −40 deg C. to +160 deg C.

In particular, a section of the busbar 9 with a pre-defined length is used in order to have a minimal resistance which causes a sufficient voltage drop such that the voltage drop can be sensed by the amplifier without too high measurement error.

Furthermore, the current sensing system 2 comprises an amplifier 11 comprising a first input A1 and a second input A2 and an output A3. The amplifier 11 is, for example a differential amplifier. The amplifier 11 is configured to sense a voltage difference across the busbar 9 caused by a current flow in the current path. In particular, the amplifier 11 is configured to sense a voltage difference or voltage drop across a section of the busbar 9 caused by a current flow in the current path. The amplifier 11 may comprise an operational amplifier.

The amplifier 11 may be an isolation amplifier providing electrical isolation.

In addition, the current sensing system 2 comprises a signal conditioning circuit 13. The signal conditioning circuit 13 comprises a first terminal S1 and a second terminal S2 wherein the first terminal S1 is connected to the output A3 of the amplifier 11.

The signal conditioning circuit 13 comprises a first stage with a temperature compensation circuit, which effects or acts as a temperature dependent resistance with a temperature coefficient which has an opposite sign as the resistance of the busbar 9. For example, if the resistance of the busbar 9 has a positive temperature coefficient the resistance of the temperature compensation circuit has a negative temperature coefficient.

For instance, the temperature compensation circuit comprises a resistor Rth and a diode D connected in series. Preferably the cathode of the diode D is directly or indirectly connected to a lower potential than the cathode of the diode D. For example, the cathode of the diode D is directly or indirectly connected to a third terminal S3 of the signal conditioning circuit 13, which is connected to a reference potential GND, for example ground. For instance, the diode D is a silicon diode with a p-n junction.

In order not to reduce the input resistance of the circuit for the signal through the diode D too much, the series connection of diode D and resistor Rth of the temperature compensation circuit is used. Preferably the temperature compensation circuit is placed near to the busbar section so that the busbar section and the diode D have as far as possible the same temperature.

For example, the first stage of the signal conditioning circuit 13 comprises a first resistor R1 wherein the first resistor R1 and the temperature compensation circuit are connected in series between the first terminal S1 and the third terminal S3 of the signal conditioning circuit 13 and an intermediate node, which is arranged between the first resistor R1 and the temperature compensation circuit, is directly or indirectly connected to the second terminal S2.

In particular, a ratio of a resistance value of the first resistor R1 to a resistance value of the resistor Rth of the temperature compensation circuit is equal to an amount of a ratio of a busbar value and a diode value, wherein the busbar value represents an increase of the amplified voltage drop of the busbar 9 due to a temperature increase in a pre-defined temperature range and the diode value represents an decrease of a forward voltage of the diode D due to the temperature increase in the pre-defined temperature range.

For example, the amplified busbar voltage drop has an increase of 1.48 V due to temperature change from −40 deg C. to 160 deg C. and the diode forward voltage has a decrease of 0.436V. Thus, the amount of the ratio of the busbar value and the diode value is RatioBD=1.48/0.436=3.44.

In order to create a constant voltage drop at the intermediate node between the first resistor R1 and the temperature compensation circuit, the ratio between the first resistor R1 and the resistor Rth of the temperature compensation circuit needs to be RatioBD=3.44.

Optionally, for adjusting a voltage level the signal conditioning circuit 13 comprises a second stage with a voltage divider circuit with a third resistor R3 and a fourth resistor R4 and the intermediate node between the first resistor R1 and the temperature compensation circuit is connected to the voltage divider circuit and an intermediate node of the voltage divider circuit between the third resistor R3 and the fourth resistor R4 is connected to the second terminal S2 of the signal conditioning circuit 13. The voltage divider circuit is scaling the first stage output voltage to a pre-defined threshold voltage level of a successive comparator 15.

The first resistor R1, the resistor Rth of the temperature compensation circuit, the third resistor R3 and fourth resistor R4 may each comprise one or multiple resistor elements.

The comparator 15 comprises a first input C1 and a second input C2, wherein the first input C1 of the comparator 15 is directly or indirectly connected to the second terminal S2 of the signal conditioning circuit 13. On the second input C2 of the comparator 15 the pre-defined threshold voltage may be applied.

The current sensing system 2 comprises a logic circuitry 17 configured to control a state of the switch 7, which is arranged in the current path dependent on an output signal of the comparator 15.

The logic circuitry 17 may comprise a set-reset latch 171, for example a SR NAND latch, which provides a state of the output signal of the comparator 15 to a higher logic and an AND-gate 175, which is configured to set the state of the switch 7. The logic circuitry 17 may comprise a microcontroller 173 which is configured to reset the set-reset latch 171 and to provide a control signal to the AND-gate 175, so that after an overcurrent has been detected and the fault condition has been cleared, the switch 7 can be closed again.

The effect of the temperature compensation can be seen in the results summarized in Tables 1 to 3. Table 1 and Table 2 show simulation results, wherein Table 3 shows measurement results.

Table 1 shows a minimum and maximum detection current detected by the current sensing system 2 under typical conditions, e. g. with typical parameters, and with a 600 mV threshold voltage of the comparator 15 in the temperature range from −40 deg C. to +160 deg C. The difference between the min. detection current and a max. detection current is about 114 A without temperature compensation and only 12 A with temperature compensation.

TABLE 1

| | Simulation results typical temperature range −40 C. to 160 C. | |
| --- | --- | --- |
| | Without temperature compensation | With temperature compensation |
| Delta Detection [A] | 114 | 12 |
| I detection min [A] | 240.9 | 302 |
| I detection max [A] | 355.6 | 314 |

Table 2 shows the minimum and maximum detection detected current by the current sensing system 2 under worst case conditions, e. g. with worst case parameters, and with a 600 mV threshold voltage of the comparator 15 in the temperature range from −40 deg C. to +160 deg C. The difference between the min. detection current and a max. detection current is about 139 A without temperature compensation and only 54 A with temperature compensation.

TABLE 2

| | Simulation results worst case temperature range −40 C. to 160 C. | |
| --- | --- | --- |
| | Without temperature compensation | With temperature compensation |
| Delta Detection [A] | 139 | 54 |
| I detection min [A] | 232 | 282 |
| I detection max [A] | 371 | 336 |

Table 3 shows a minimum and maximum detection current detected by the current sensing system 2 with a 600 mV threshold voltage of the comparator 15 in the temperature range from −40 deg C. to +160 deg C. With temperature compensation the difference between the min. detection current and a max. detection current is about 15 A.

TABLE 3

| | Measurement results temperature range −40 C. to 160 C. With temperature compensation |
| --- | --- |
| Delta Detection [A] | 15 |
| I detection min [A] | 309 |
| I detection max [A] | 324 |

Thus, the temperature compensation effects that the tolerance for the resulting shut-OFF current is sufficiently small and system efficiency can be improved.

REFERENCE SIGNS 1 high voltage system
2 current sensing system

3 power supply
5 load
7 switch
9 busbar
11 amplifier
13 signal conditioning circuit
15 comparator
17 logic circuitry
171 latch
173 microcontroller
175 AND-gate
A1, A2 input of amplifier
A3 amplifier output
C1, C2 input of comparator
C3 output of comparator
D diode
GND reference potential
R1 first resistor
R3 third resistor
R4 fourth resistor
Rth resistor of temperature compensation circuit
S1, S2, S3 terminal of the signal conditioning circuit

The invention claimed is:

1. A current sensing system, comprising:

a busbar connected in a current path between a power supply and a load, said busbar having a temperature dependent resistance with a specific temperature coefficient;

a switch is disposed in the current path;

an amplifier having a first input, a second input and an output, said first input and said second input connected to said busbar, and said amplifier configured to sense a voltage difference across a section of said busbar caused by a current in the current path;

a signal conditioning circuit having a first terminal, a second terminal and a temperature compensation circuit, said first terminal connected to said output of said amplifier, and said temperature compensation circuit acting as a temperature dependent resistance with a temperature coefficient having a sign opposite to the specific temperature coefficient of the temperature dependent resistance of said busbar;

a comparator having a first input and a second input, said first input of said comparator directly or indirectly connected to said second terminal of said signal conditioning circuit; and logic circuitry configured to control a state of said switch disposed in the current path, in dependence on an output signal of said comparator.

2. The current sensing system according to claim 1, wherein:

said signal conditioning circuit includes a first resistor and a third terminal;

said first resistor and said temperature compensation circuit connected in series between said first terminal and said third terminal of said signal conditioning circuit; and an intermediate node is disposed between said first resistor and said temperature compensation circuit, and said intermediate node is directly or indirectly connected to said second terminal.

3. The current sensing system according to claim 2, which further comprises:

a voltage divider circuit having an intermediate node connected to said second terminal of said signal conditioning circuit;

said intermediate node disposed between said first resistor and said temperature compensation circuit being connected to said voltage divider circuit.

4. The current sensing system according to claim 1, wherein the resistance of the busbar includes a positive temperature coefficient.

5. The current sensing system according to claim 1, wherein said temperature compensation circuit includes a resistor and a diode connected in series.

6. The current sensing system according to claim 5, wherein said diode is a silicon diode with a p-n junction.

7. The current sensing system according to claim 5, wherein:

a ratio of a resistance value of said first resistor to a resistance value of said resistor of said temperature compensation circuit is equal to an amount of a ratio of a busbar value and a diode value;

the busbar value represents an increase of an amplified voltage drop of said busbar due to a temperature increase in a pre-defined temperature range; and the diode value represents a decrease of a forward voltage of said diode due to the temperature increase in the pre-defined temperature range.

8. The current sensing system according to claim 1, wherein said busbar includes a copper alloy, said copper alloy includes copper, nickel, and silicon, or said copper alloy includes copper and silicon.

9. A catalyst system for a vehicle, the catalyst system comprising the current sensing system according to claim 1, and a catalyst, said catalyst configured to be connected via said busbar to the power supply.

10. A current sensing system, comprising:

a busbar connected in a current path between a power supply and a load, said busbar having a temperature dependent resistance with a positive temperature coefficient;

a switch is disposed in the current path;

an amplifier having a first input, a second input and an output, said first input and said second input connected to said busbar, and said amplifier configured to sense a voltage difference across a section of said busbar caused by a current in the current path;

a signal conditioning circuit having a first terminal, a second terminal and a temperature compensation circuit, said first terminal connected to said output of said amplifier, said temperature compensation circuit acting as a temperature dependent resistance with a temperature coefficient having a sign opposite to the positive temperature coefficient of the temperature dependent resistance of said busbar, and said temperature compensation circuit including a resistor and a diode connected in series, said diode being a silicon diode with a p-n junction;

a comparator having a first input and a second input, said first input of said comparator directly or indirectly connected to said second terminal of said signal conditioning circuit; and logic circuitry configured to control a state of said switch disposed in the current path, in dependence on an output signal of said comparator.

11. The current sensing system according to claim 10, wherein:

said signal conditioning circuit includes a first resistor and a third terminal;

said first resistor and said temperature compensation circuit connected in series between said first terminal and said third terminal of said signal conditioning circuit; and an intermediate node is disposed between said first resistor and said temperature compensation circuit, and said intermediate node being directly or indirectly connected to said second terminal.

12. The current sensing system according to claim 11, which further comprises:

a voltage divider circuit having an intermediate node connected to said second terminal of said signal conditioning circuit;

said intermediate node disposed between said first resistor and said temperature compensation circuit being connected to said voltage divider circuit.

13. The current sensing system according to claim 11, wherein:

a ratio of a resistance value of said first resistor to a resistance value of said resistor of said temperature compensation circuit is equal to an amount of a ratio of a busbar value and a diode value;

the busbar value represents an increase of an amplified voltage drop of said busbar due to a temperature increase in a pre-defined temperature range; and the diode value represents a decrease of a forward voltage of said diode due to the temperature increase in the pre-defined temperature range.

14. The current sensing system according to claim 11, wherein said busbar includes a copper alloy, said copper alloy includes copper, nickel, and silicon, or said copper alloy includes copper and silicon.

\* \* \* \* \*